(12) United States Patent
Kim

(10) Patent No.: US 10,892,248 B2
(45) Date of Patent: Jan. 12, 2021

(54) MULTI-STACKED DIE PACKAGE WITH FLEXIBLE INTERCONNECT

(71) Applicant: Intel Corporation, Santa Clara, CA (US)

(72) Inventor: Hyoung Il Kim, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/349,951

(22) PCT Filed: Dec. 20, 2016

(86) PCT No.: PCT/US2016/067833
§ 371 (c)(1),
(2) Date: May 14, 2019

(87) PCT Pub. No.: WO2018/118027
PCT Pub. Date: Jun. 28, 2018

(65) Prior Publication Data
US 2019/0333895 A1    Oct. 31, 2019

(51) Int. Cl.
*H01L 23/00* (2006.01)
*H01L 23/538* (2006.01)
(Continued)

(52) U.S. Cl.
CPC .......... *H01L 24/86* (2013.01); *H01L 21/4825* (2013.01); *H01L 21/4839* (2013.01);
(Continued)

(58) Field of Classification Search
CPC .............. H01L 23/48; H01L 23/49524; H01L 23/49527; H01L 23/49544; H01L 23/49548; H01L 23/49551; H01L 23/4985; H01L 23/49866; H01L 23/49838; H01L 2224/83851; H01L 24/50; H01L 24/42; H01L 24/43; H01L 24/47; H01L 24/64; H01L 24/65; H01L 24/68; H01L 24/80;
(Continued)

(56) References Cited

U.S. PATENT DOCUMENTS 5,933,712 A    8/1999  Bernhardt et al.
2001/0012643 A1  8/2001  Asada
(Continued)

FOREIGN PATENT DOCUMENTS

KR    2001-0025861    4/2001

OTHER PUBLICATIONS

International Preliminary Report on Patentability for PCT Application No. PCT/US16/67833, dated Jul. 4, 2019.
International Search Report and Written Opinion for International Patent Application No. PCT/US16/67833, dated Aug. 30, 2017.

*Primary Examiner* — Eduardo A Rodela
(74) *Attorney, Agent, or Firm* — Green, Howard & Mughal LLP.

(57) ABSTRACT

An apparatus is provided which comprises: a first die having at least one bond pad; a first flexible layer comprising an anisotropic conductive material, wherein the first flexible layer is adjacent to the at least one bond pad such that it makes an electrical contact with the at least one bond pad; and a second flexible layer comprising a conductive metal, wherein the second flexible layer is adjacent to the first flexible layer.

17 Claims, 8 Drawing Sheets

(51) Int. Cl.
*H01L 25/065* (2006.01)
*H01L 23/495* (2006.01)
*H01L 21/48* (2006.01)

(52) U.S. Cl.
CPC .. *H01L 23/49524* (2013.01); *H01L 23/49527* (2013.01); *H01L 23/49548* (2013.01); *H01L 23/49551* (2013.01); *H01L 23/49555* (2013.01); *H01L 23/49572* (2013.01); *H01L 23/5385* (2013.01); *H01L 23/5386* (2013.01); *H01L 23/5387* (2013.01); *H01L 24/50* (2013.01); *H01L 25/0657* (2013.01); *H01L 2225/06551* (2013.01)

(58) Field of Classification Search
CPC ..... H01L 24/86; H01L 21/48; H01L 21/4814; H01L 21/4821; H01L 21/4825; H01L 21/4839
See application file for complete search history.

(56) References Cited

U.S. PATENT DOCUMENTS

| | | | |
|---|---|---|---|
| 2008/0036063 A1* | 2/2008 | Kim | H01L 25/0657 257/686 |
| 2008/0088001 A1* | 4/2008 | Kim | H01L 25/0657 257/686 |
| 2008/0122113 A1* | 5/2008 | Corisis | H01L 25/0657 257/777 |
| 2008/0157324 A1* | 7/2008 | Tang | H01L 25/0657 257/686 |
| 2008/0284043 A1* | 11/2008 | Hagen | H01L 25/105 257/777 |
| 2010/0018755 A1* | 1/2010 | Tatsuzawa | H01R 4/04 174/254 |
| 2010/0019338 A1 | 1/2010 | Kwon et al. | |
| 2010/0207279 A1* | 8/2010 | Law | H01L 24/84 257/778 |
| 2010/0213596 A1 | 8/2010 | Kim | |
| 2011/0291295 A1* | 12/2011 | Isa | H01L 24/49 257/777 |
| 2017/0200698 A1* | 7/2017 | Graf | H01L 23/48 |

* cited by examiner

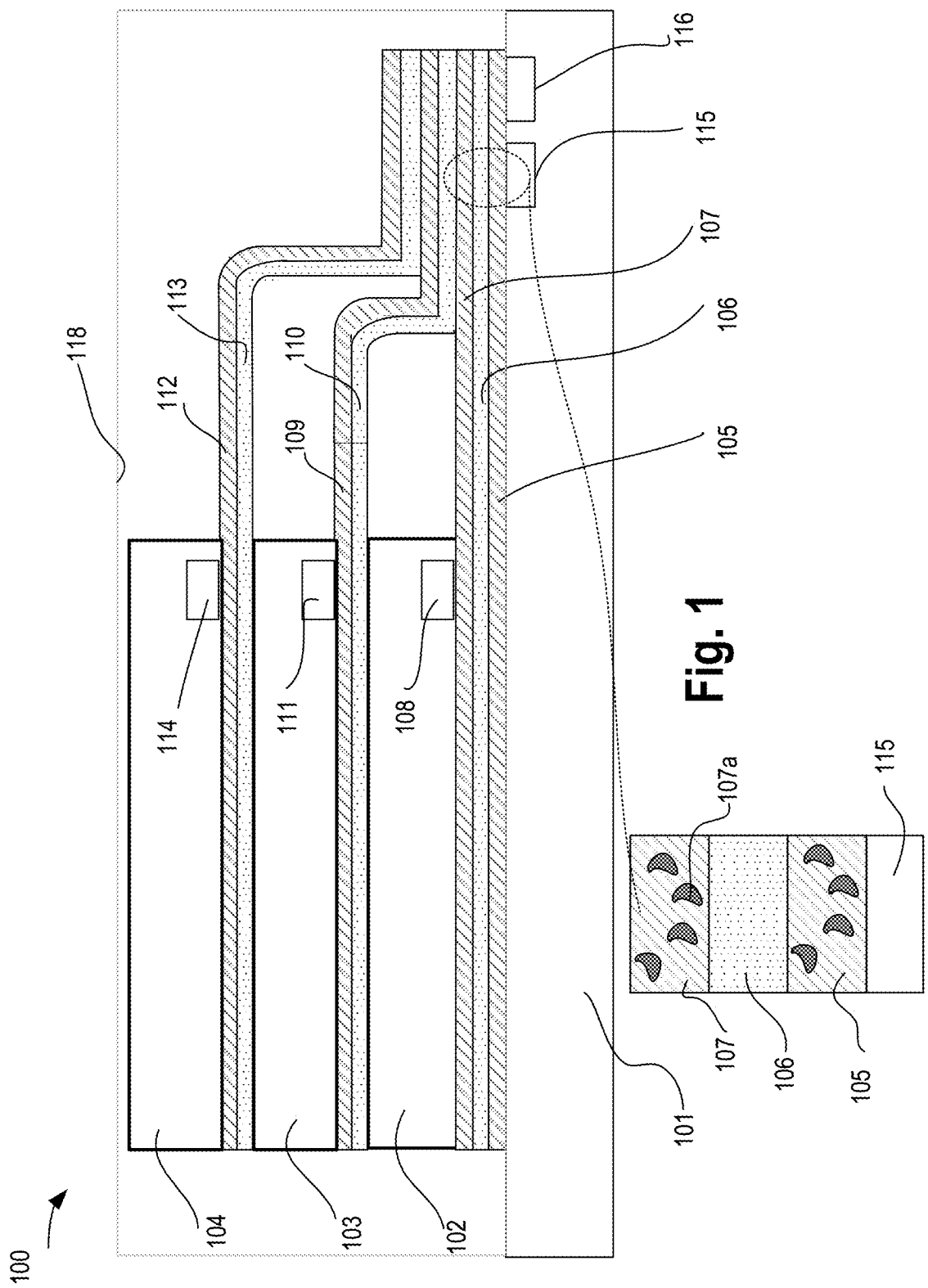

MULTI-STACKED DIE PACKAGE WITH FLEXIBLE INTERCONNECT

CLAIM OF PRIORITY

This Application is a National Stage Entry of, and claims priority to, PCT Application No. PCT/US16/67833, filed on 20 Dec. 2016 and titled "MULTI-STACKED DIE PACKAGE WITH FLEXIBLE INTERCONNECT," which is incorporated by reference in its entirety for all purposes.

BACKGROUND

A common interconnect technology used in processor or die packages is wire-bonding interconnect technology. However, wire-bonding interconnect technology is challenged by tighter bond pitches, more number of input-output (IO) pins, and lower wire bond loop height between the die for thin Z-height package options. Most mobile and wearable markets demand thinner package options, but with more functions, storage, and performance. Recently, through-silicon-via (TSV) technology is being adopted for faster and power-efficient applications providing lower Z-height advantage. However, the TSV technology is very expensive.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1 illustrates a cross-sectional view of a packaging system where multiple dies are interconnected using a composite layer formed of Anisotropic Conductive Film (ACF) and a conductive layer, according to some embodiments of the disclosure.

DETAILED DESCRIPTION

Figure 2A:
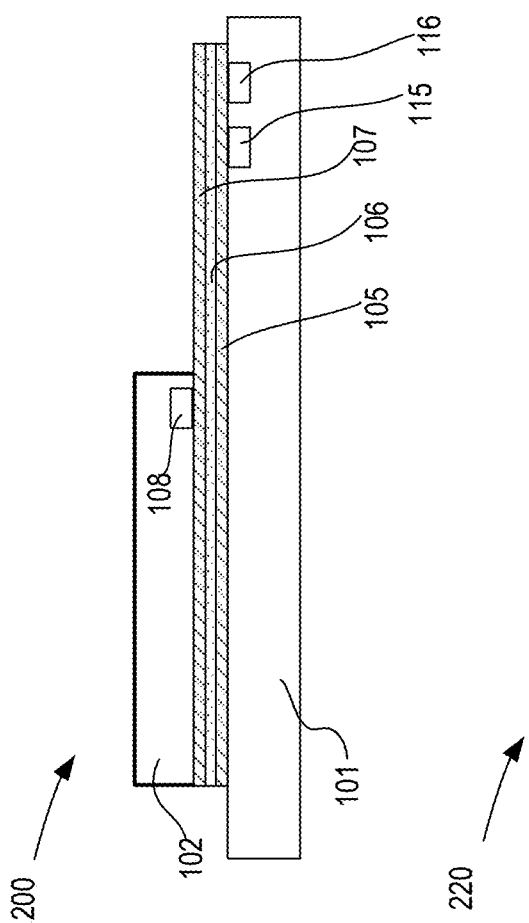
FIGS. 2A-D illustrate cross-sectional views of the packaging system showing the process flow, according to some embodiments of the disclosure.
Figure 2B:
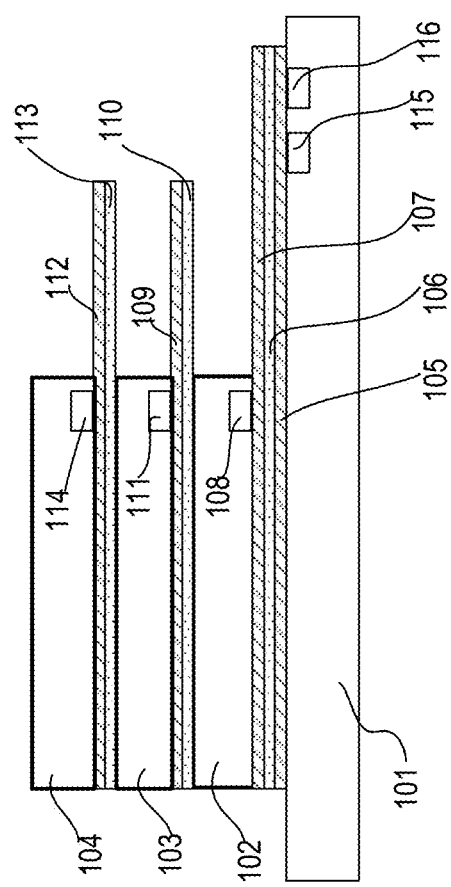
Figure 2C:
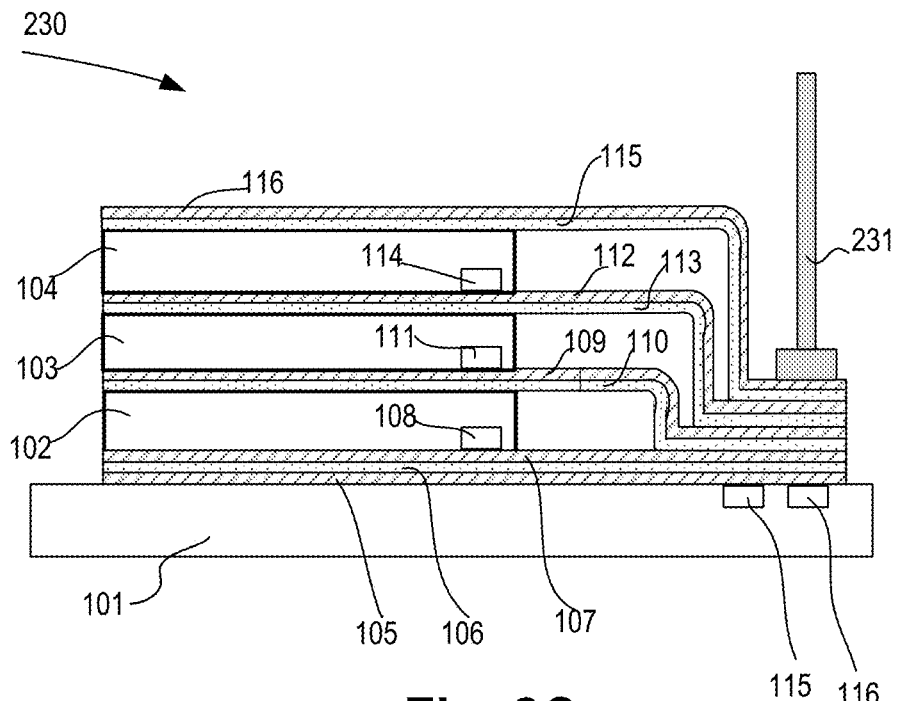
Figure 2D:
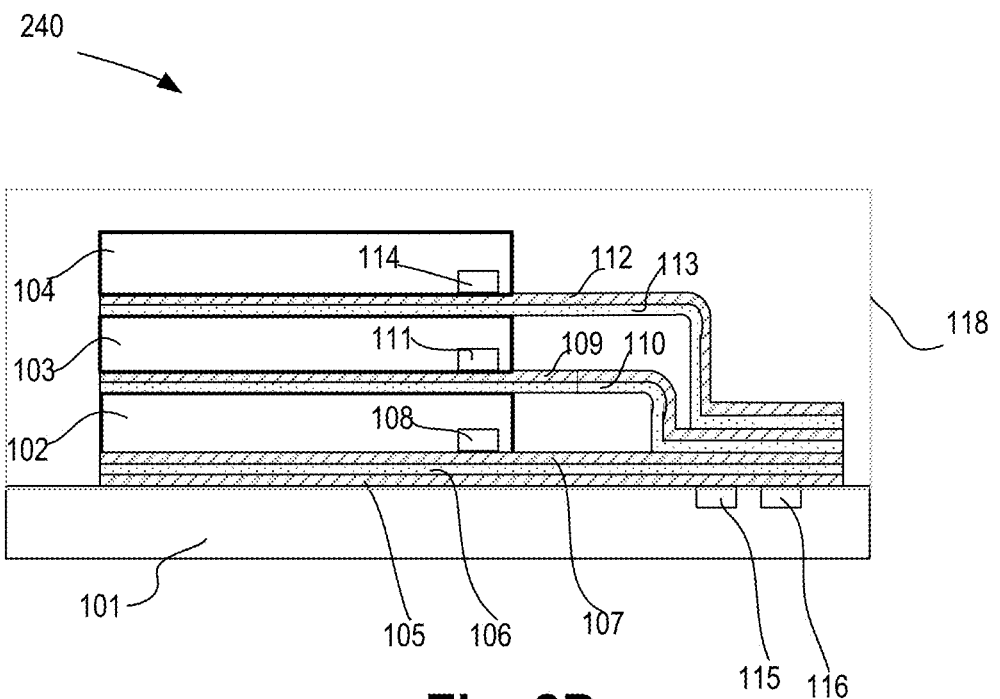

Various embodiments describe a novel interconnect which comprises a composite layer which includes a patterned conductive layer (e.g., Cu, Al, Au, etc.) and an Anisotropic Conductive Film (ACF). In some embodiments, this composite layer is provided between multi-stacked dies, and then attached to a contact on a substrate (e.g., motherboard, package substrate, etc.). In some embodiments, electrical connection between the multi-stacked dies can be made of a combination of ACF and conductive layer. For example, an electrical signal from a die in the stack travels through the ACF layer and continues to travel to the substrate through the conductive layer. In some embodiments, the ACF layer provides batch electrical connection. For example the ACF layer attaches to hundreds of bond pads on die without shorting each other since it conducts in one direction. In some embodiments, the ACF layer is applied to the top of die using thermo-compression loading. As such, conductive particles in the ACF layer touch each other and create a single directional electrical path between the bond pads to the conductive layer. In some embodiments, the conductive layer delivers the signals towards the substrate.

There are many technical effects of the various embodiments. For example, wire-sweep concerns are mitigated by the flexible composite layer which is well-attached to the die(s) and/or substrate. The Z-height issues associated with wire-bonding loop height are also removed because flexible composite layer can follow the contour of the multi-stack dies and the substrate. The composite layer of the various embodiments has a shorter assembly time compared to wire-bonding assembly time because there are no wire-bonding stiches to perform, and further there are no Die Attach File (DAF) cures to be performed for the composite layer. Various embodiments also provide higher throughput and batch processing of die to substrate connection since hundreds of bond pads can be connected through a single thermo-compression bonding process. The composite layer of some embodiments can also reduce the x-dimension, y-dimension, and/or z-dimension of the die stacks compared to the wire-bonding technology since no wire loop height or die overhang is used. Compared to through-silicon vias (TSVs) used for connecting dies within multi-stacked dies, the composite layer of the various embodiments does not require modification of silicon (e.g., adjustments to via or bumps, etc.), and as such the overall packaging system is cheaper than TSVs. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates cross-sectional view 100 of a packaging system where multiple dies are interconnected using a composite layer formed of ACF and a conductive layer, according to some embodiments of the disclosure. The packaging system includes substrate 101, first die 102, second die 103, third die 104, ACF layers 105, 107, 109, and 112, and conductive layers 106, 110, and 113.

In this example, three dies are shown in a single stack. However, the embodiments are not limited to three dies. Nor are the embodiments limited to a single stack. In some embodiments, a stack of dies can be adjacent to another stack of dies or a single die. For example, a stack of dies is placed laterally along the same plane with another die or a stack of dies. In some embodiments, these various dies can be connected with one another using the composite layer of various embodiments. Each die may have one or more bond pads. The bond pads may be formed from a combination of bumps and solder balls, in some examples. In this example, a single bond pad is shown for each die for sake of simplicity. For example, die 102 includes bond pad 108, die 103 includes bond pad 111, and die 104 includes bond pad 114. Further, for sake of simplicity, two bond pads 115 and 116 are shown in substrate 101. These bond pads are also referred to as bond fingers in substrate 101. However, a person skilled in the art would appreciate that any number of bond pads are associated with substrate 101. In some embodiments, one or all dies may include one or more TSVs.

In some embodiments, one or more of the dies are single dies. For example, dies 102, 103, and 104 are single dies instead of containing multiple dies. In other embodiments, one or more of the dies may include two or more dies. For example, in some embodiments die 102 and/or die 103 may be a wafer (or portion of a wafer) having two or more dies formed on it. In some embodiments, one or more of the dies are embedded in an encapsulant. For example, die 102 and/or die 103 includes two or more dies embedded in an encapsulant. In some embodiments, the two or more dies are arranged side-by-side, vertically stacked, or positioned in any other suitable arrangement.

The dies of various embodiments can include any integrated circuit. For example, one die can be a baseband processor, another die can include active or passive components (e.g., amplifier, inductor, capacitor), and another die can be a radio frequency (RF) integrated circuit. The dies can also be a general purpose or specific purpose processor.

In some embodiments, package substrate 101 may be a conventional cored substrate and/or an interposer. In some embodiments, substrate 101 is a multi-layer substrate with signal, power, and ground routings distributed in various layers. In some embodiments, these signal, power, and ground routings are connected to bond pads 115/116 and routed to different dies in the stack. Any known suitable material can be used for forming CPU substrate 101. In some embodiments, substrate 101 is a package substrate that may be composed of a polymer, ceramic, glass, or semiconductor material. In some embodiments, substrate 101 may be formed of an epoxy resin, a fiberglass-reinforced epoxy resin, a ceramic material, or a polymer material such as polyimide. In some embodiments, substrate 101 may be formed of alternate rigid or flexible materials, such as silicon, germanium, and other group III-V and group IV materials of the Periodic Table.

In some embodiments, substrate 101 may include metal interconnects and vias including but not limited to TSVs. In some embodiments, substrate 101 may include embedded devices including both passive and active devices. Such devices may include, but are not limited to, capacitors, decoupling capacitors, resistors, inductors, fuses, diodes, transformers, sensors, electrostatic discharge (ESD) devices, and memory devices. In some embodiments, substrate 101 may include complex devices such as RF (radio frequency) devices, power amplifiers, power management devices, antennas, arrays, sensors, and MEMS (microelectromechanical systems), etc.

In some embodiments, dies 102, 103 and/or 104 may be a primary logic die. In some embodiments, dies 102, 103 and/or 104 may be configured to function as memory, an application specific circuit (ASIC), a processor, an radio frequency (RF) integrated circuit (IC), baseband processor, or some combination of such functions. For example, die 102 may include a processor, die 103 may include memory, and die 104 may include a RF IC. In some embodiments, one or all dies may be embedded in an encapsulant 118. In some embodiments, encapsulant or mold 118 can be any suitable material, such as an Ajinomoto Build-up Film (ABF) substrate, other dielectric/organic materials, resins, epoxies, polymer adhesives, silicones, acrylics, polyimides, cyanate esters, thermoplastics, and/or thermosets.

In some embodiments, substrate 101 is a circuit board (or motherboard) which may be a PCB (printed circuit board) composed of an electrically insulative material such as an epoxy laminate. For example, circuit board 101 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material.

In some embodiments, layer 105 of ACF is coupled to substrate 101 such that when layer 105 is compressed towards substrate 101, it makes an electrical connection with at least one bond pad of substrate 101. In this example, layer 105 is electrically connected to bond pads 115 and 116 of substrate 101. In some embodiments, bond pads of each die are coupled to a corresponding ACF file. For example, layer 107 of ACF is coupled to die 102 such that it makes an electrical connection with bond pad 108, layer 109 of ACF is coupled to die 103 such that it makes an electrical connection with bond pad 111, and layer 112 of ACF is coupled to die 104 such that it makes an electrical connection with bond pad 114. Here, a pair of ACF layer and conductive layer form a flexible composite layer. These composite layers are thermally compressed near one of their ends (e.g., the free end which is not coupled to the die) and grouped together to couple to bond pads 115 and 116 as shown.

ACF is a material which comprises one of resin, epoxy, or acryl which contain conductive particles 107a. In some embodiments, a lamination process is applied to mount layer 105 of ACF to substrate 101. The same process may be used for coupling ACF layer 107 with die 102, ACF layer 109 with die 103, and ACF layer 112 with die 104. In some embodiments, the coupling of layer 105 to substrate 101 is done without heat or with minimal amount of heat which is sufficient to cause the anisotropic material to become slightly sticky. The same process may be used for coupling ACF layer 107 with die 102, ACF layer 109 with die 103, and ACF layer 112 with die 104. In some cases, to make a functional electrical connection with bond pads, conductive particles 107a are tapped to conductive layer and the bond pad. For example, conductive particles in 107a in ACF layer 105 form an electrical connection between bonding pads 115/116 and conductive layer 106. Likewise, conductive particles 107a in ACF layer 109 form an electrical connection between bonding pad 111 and conductive layer 110. The conductive layers may be a solid layer (e.g., when one single routing is desired) or a pattered layer to route many signals on a single layer from die bonding pads to substrate bonding pads (or to other die bonding pads). The conductive layers may be formed of any conducting material such as Cu, Ag, Al, Au, etc.

In this example, the active side of dies 102, 103, and 104 are facing down towards substrate 101. Here, the term "active side" (also referred to as the "front side") refers to the side of the die which has the transistors (e.g., active devices or diffusion region) closer to it. In contrast, the term "back side" refers to the side of the die opposite to the active side. Generally, the back side of the die accesses metal layers away from the diffusion region. In some embodiments, composite interconnect layer (e.g., ACF layers 107, 109, and 112) is applied on to the active side of the die (which may, on a case-by-case basis, use pre-applied polyimide on the die to prevent electrical shorts). As discussed here, electrical connection is made through conductive particles in the ACF layer under thermal compression bonding. In various embodiments, the conductive layers (e.g., layers 106, 110, 113) are a patterned metal foil (which is flexible) and used to deliver the signal along the length direction of the conducting layer. In various embodiments, the ACF layers provide current propagation or flow in one direction.

The composite interconnect layers (e.g., ACF layers 107, 109, and 112) can be attached in various configurations. For example, an active side of one die may face an active side of another die. In another example, active sides of all the dies face away from substrate 101. In yet another example, active side of some dies face down towards substrate 101 while the active side of some dies may face away from substrate 101.

In some embodiments, the dies are configured in front-to-back configuration. For example, die 102 may be coupled to die 103 in a front-to-back configuration (e.g., the "front" or "active" side of die 102 is coupled to the "back" or "inactive" side 103. In some embodiments, dies may be coupled with one another using the composite layers in a front-to-front, back-to-back, or side-to-side arrangement.

FIGS. 2A-D illustrate cross-sectional views 200, 220, 230, and 240, respectively, of the packaging system showing the process flow, according to some embodiments of the disclosure. It is pointed out that those elements of FIGS. 2A-D having the same reference numbers (or names) as the elements of any other figure can operate or function in any manner similar to that described, but are not limited to such.

Cross-section 200 illustrates mounting of die 102 on ACF layer 107 which is attached to conductive metal 106, which in turn is attached to ACF layer 105 which in turn is attached to substrate 101. In some embodiments, thermo-compression is applied to electrically couple conducting particles of ACF layer 105 to bonding pad(s) 115/116. In some embodiments, die 102 is pressed onto ACF layer 107 so that the conducting particles of ACF layer 107 electrically couple to bonding pad 108.

Cross-section 220 illustrates the stacking of dies. In this example, dies 103 and 104 are stacked such that they are separated from one another by the composite layers. For example, die 103 is mounted on ACF layer 109 which is attached to conductive metal 110. In some embodiments, die 103 is pressed onto ACF layer 109 so that the conducting particles of ACF layer 109 electrically couple to bonding pad 111. In some embodiments, die 104 is mounted on ACF layer 112 which is attached to conductive metal 113. In some embodiments, die 104 is pressed onto ACF layer 112 so that the conducting particles of ACF layer 112 electrically couple to bonding pad 114.

Cross-section 230 illustrates the application of thermal compression bonding (also referred to as diffusion bonding, pressure joining, or solid state welding) on the portions of the composite layers away from dies 102, 103, and 104. The process of thermo-compression bonding causes atoms to migrate from one crustal lattice to another based on crystal lattice vibration. In some embodiments, thermal compression is applied by compressor 231 which may apply pressure at high temperature (e.g., 100° C.) to group the three composite layers (e.g., pairs of 116/115, 112/113, and 109/110 with layers 107/106/105 as shown). Cross-section 240 illustrates the package system after thermo-compression bonding and formation of encapsulant 118.

Figure 3:
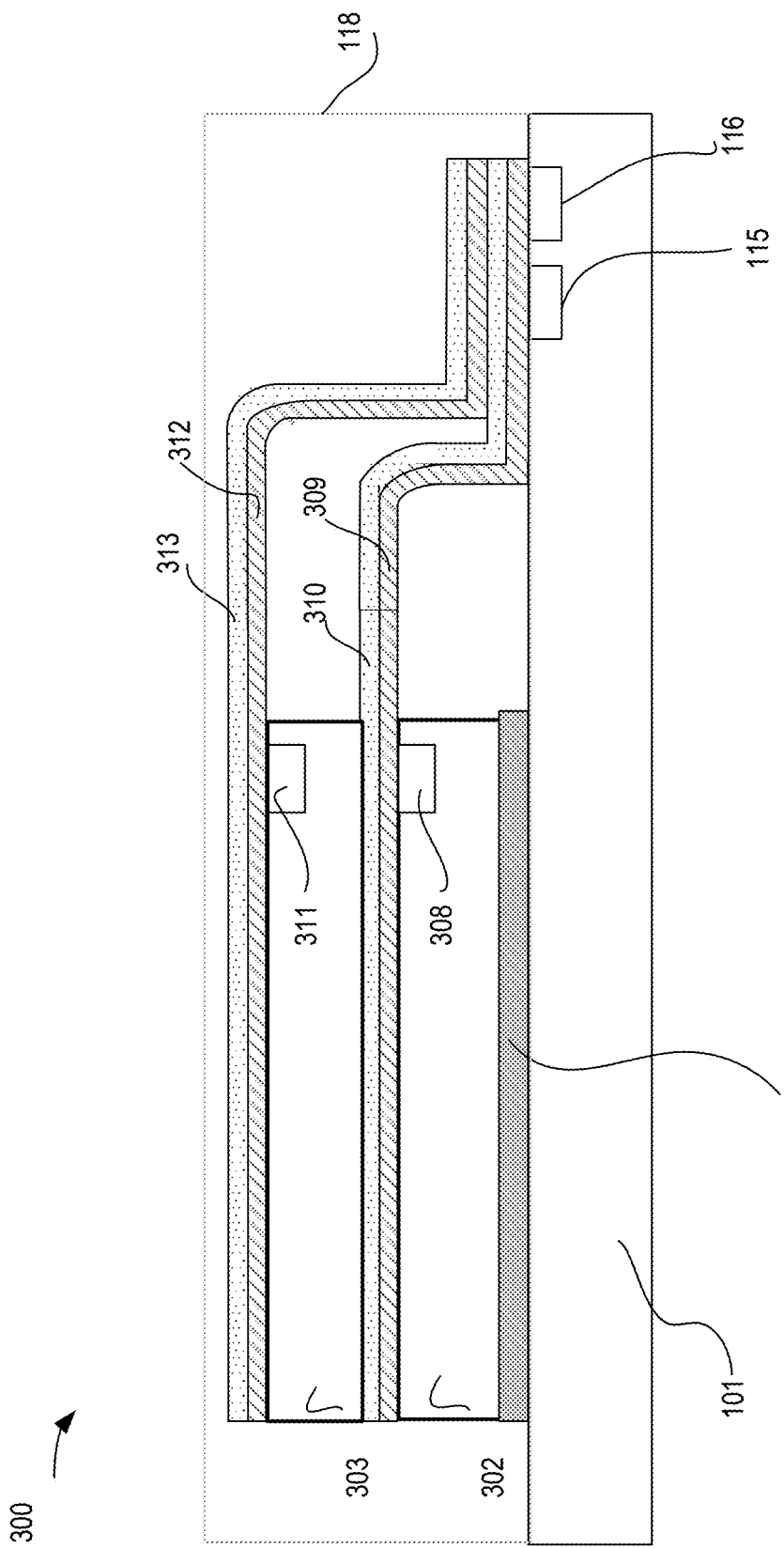
FIG. 3 illustrates a cross-sectional view of a packaging system where multiple dies with their active layers facing away from a substrate are interconnected using a composite layer formed of ACF and a conductive layer, according to some embodiments of the disclosure.

FIG. 3 illustrates cross-sectional view 300 of a packaging system where multiple dies with active layer facing away from substrate 101 are interconnected using a composite layer formed of ACF and a conductive layer, according to some embodiments of the disclosure. It is pointed out that those elements of FIG. 3 having the same reference numbers (or names) as the elements of any other figure can operate or function in any manner similar to that described, but are not limited to such. The main difference between the configuration of FIG. 3 and FIG. 1 is that the active sides of the dies are facing up and away from substrate 101. Dies 302 and 303 can be like any of the dies 102 and 103 except for having their active sides up. For example, die 302 is provided with an active side facing up. In this example, ACF layer 309 is adjacent to the active side of die 302 and makes an electrical connection to bond pad 308 of die 302. Conductive layer 310 is tightly coupled to ACF layer 309 to form a composite flexible interconnect which is configured (e.g., by using thermo-compression bonding) to couple to bonding pads 115 and 116 of substrate 101. In some embodiments, additional dies are stacked on top of die 302. For example, die 303 is stacked over die 302 such that composite layer (made of 310 and 309) are sandwiched between them.

Continuing with the example, die 303 has at least one bonding pad 311 which is coupled to ACF layer 312 which is adjacent to conducting layer 313, where ACF layer 312 and conducting layer 313 together form another composite layer. The two composite layers in this example are configured to couple one another using thermo-compression bonding as discussed with reference to FIG. 1 and FIG. 2C. Here, since the active side of die 302 is up (e.g., facing away from substrate 101), no ACF layer is needed under die 302 and over substrate 101. In some embodiments, a landing pad or interposer layer 314 is added between die 302 and substrate 101 such that TSVs in substrate 101 can be used for making an electrical connection with die 302 through its back-side, in accordance with some embodiments. Layer 314 can also be a die attach film, polymer based electrically non-conductive film, to stick the silicon die 302 with substrate 101. In some embodiments, layer 314 may be used to compensate coefficient of thermal expansion (CTE) mismatch between silicon to substrate (e.g., between die 302 and substrate 101). In some embodiments, layer 314 is a film type of thermal interface material to help heat conduction from an integrated circuit (IC) component (e.g., die 302) to motherboard through substrate. Material wise, ACF layers 309 and 312 are same as ACF layer 107. Likewise, material wise, conducting layers 310 and 313 are same as conducting layer 106.

Figure 4:
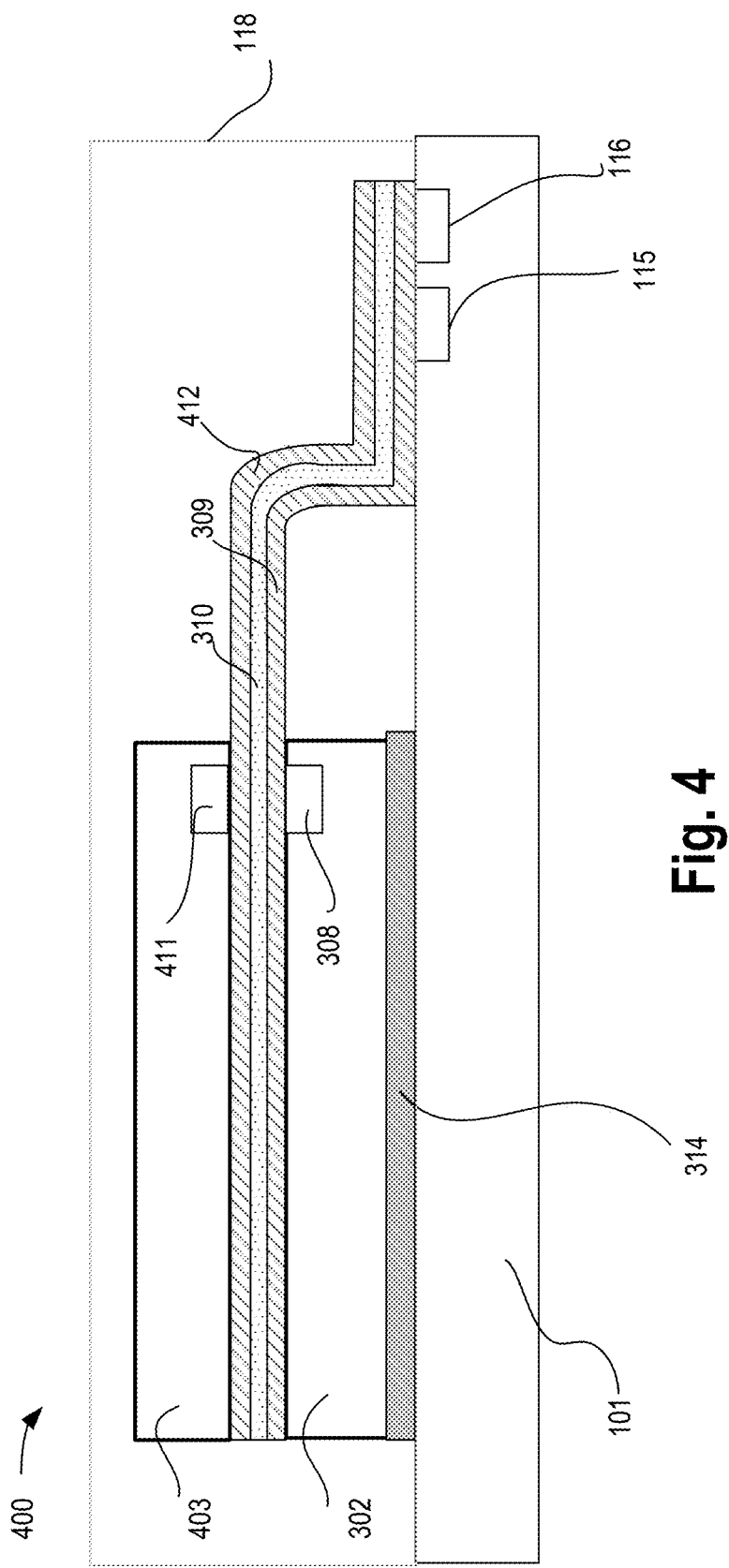
FIG. 4 illustrates a cross-sectional view of a packaging system where multiple dies with active layers facing one another are interconnected to a substrate using a composite layer formed of ACF and a conductive layer, according to some embodiments of the disclosure.

FIG. 4 illustrates cross-sectional view 400 of a packaging system where multiple dies with active layers facing one another are interconnected to substrate 101 using a composite layer formed of ACF and a conductive layer, according to some embodiments of the disclosure. In some embodiments, active-side dies can be stacked with back-side dies forming a hybrid stack of dies. In this example, a stack of two dies are shown, however, the embodiments are not limited to two dies. Any number of active-side and back-side dies can be stacked together and electrically connected using the flexible composite layers. Here, die 403 is like die 103 with its active-side facing towards substrate 101. In some embodiments, at least one bond pad 411 of die 403 is coupled to ACF layer 412 which is adjacent to conducting layer 310. In this embodiment, conducting layer 310 (which is a patterned layer) is used for providing electrical paths from bonding pads of dies 302 and 403 to bonding pads 115 and 116. As such, conducting layer 310 is shared by ACF layers 309 and 412. Material wise, ACF layer 412 is same as ACF layer 107.

Figure 5:
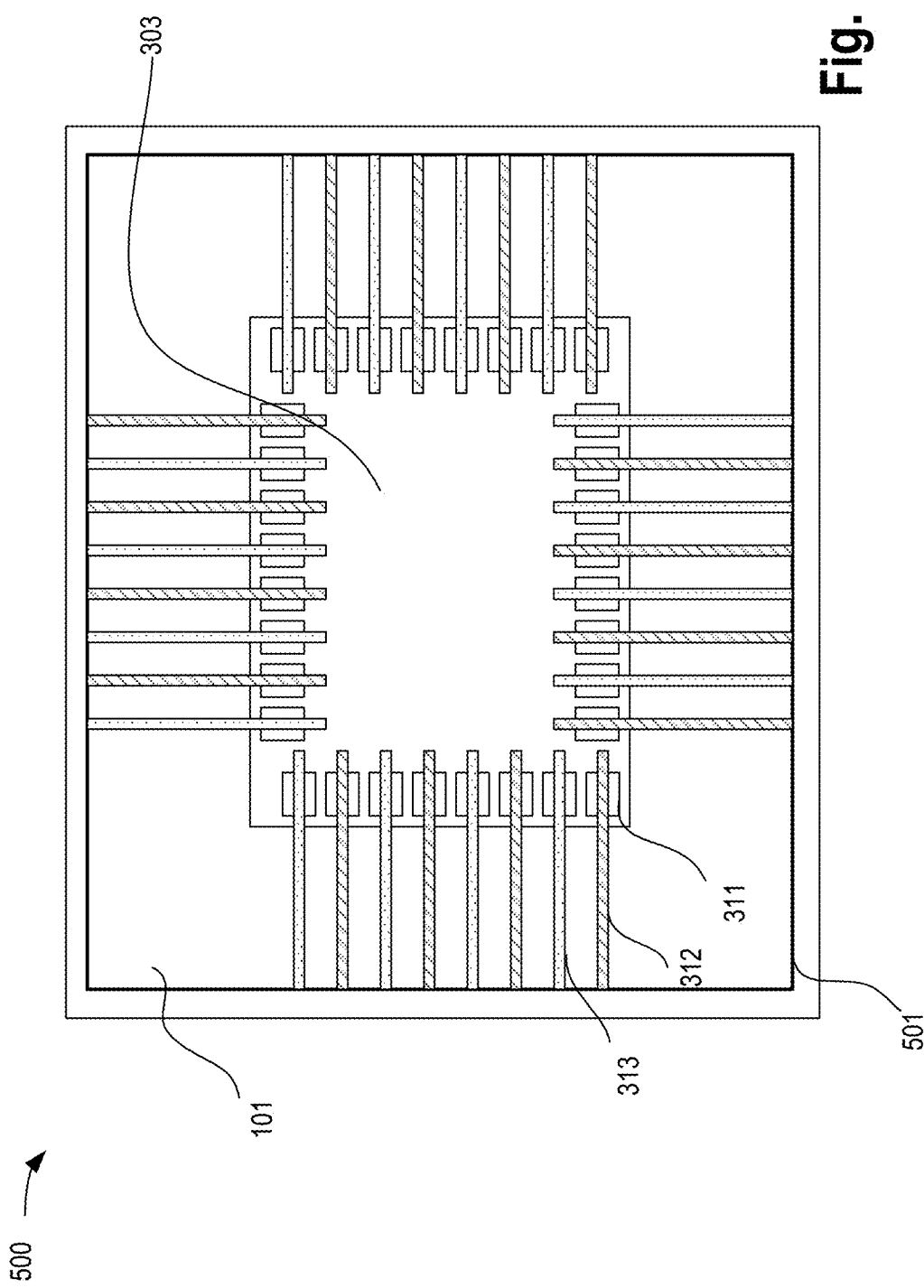
FIG. 5 illustrates a top view of a packaging system where bond pads are attached to flexible ACF and conducting layers in an alternate fashion, according to some embodiments of the disclosure.

FIG. 5 illustrates top view 500 of a packaging system where bond pads are attached to flexible ACF and conducting layers in an alternate fashion, according to some embodiments of the disclosure. It is pointed out that those elements of FIG. 5 having the same reference numbers (or names) as the elements of any other figure can operate or function in any manner similar to that described, but are not limited to such. In this example, the bonding pads of die 303 are alternatively coupled to ACF layers and conducting layers. For example, one bonding pad is coupled to ACF layer 312 and another coupled to conducting layer 313. This figure shows the top view of how each layers of die, ACF layer, and conductive layer are arranged. Here, the thin lines (e.g., 312, 313) are conductive layers. In some embodiments, another ACF layer 501 is provided. In some embodiments, conductive layers can be pre-assembled with ACF 501, and simply mounted on the top of the die 303.

Figure 6:
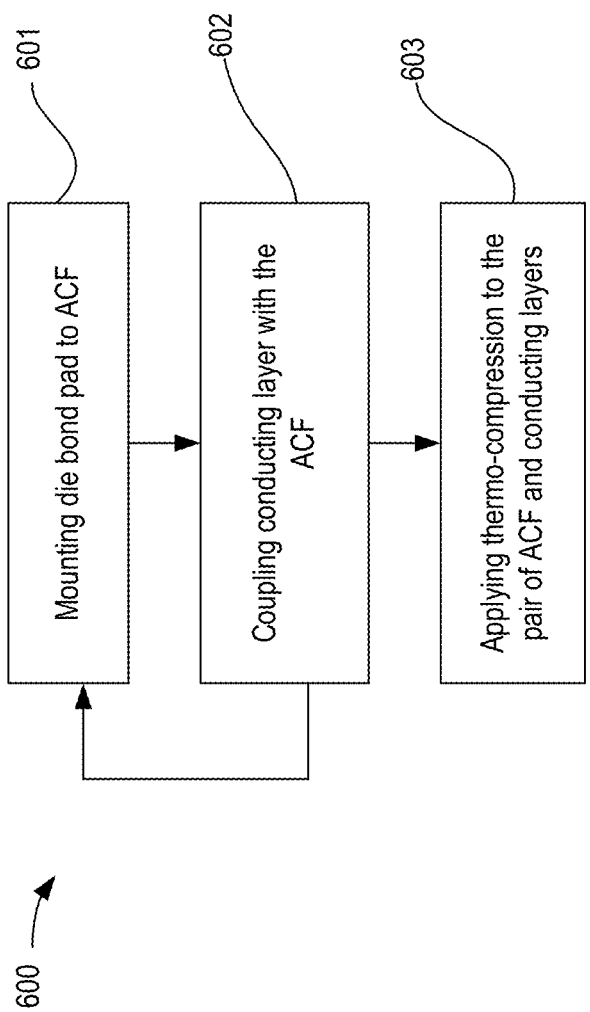
FIG. 6 illustrates a flowchart of a method of forming the package system, in accordance with some embodiments.

FIG. 6 illustrates flowchart 600 of a method of forming the package system, in accordance with some embodiments. It is pointed out that those elements of FIG. 6 having the same reference numbers (or names) as the elements of any other figure can operate or function in any manner similar to that described, but are not limited to such. Although the blocks in the flowchart with reference to FIG. 6 are shown in a particular order, the order of the actions can be modified. Thus, the illustrated embodiments can be performed in a different order, and some actions/blocks may be performed in parallel. Some of the blocks and/or operations listed in FIG. 6 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 601, a die is provided which is coupled to ACF layer. For example, die 102 is coupled to ACF layer 107 such that bonding pad 108 makes an electrical connection with conducting particles of ACF layer 107. In another example, ACF layer 107 can be mounted on a die bond pad. At block 602, a conducting layer is coupled to the ACF layer forming a flexible composite layer. For example, layer 106 is coupled to ACF layer 107. In some embodiments, a composite layer may be formed first and then the ACF layer of the composite layer is attached to bonding pad 108 of die 102. In some embodiments, multiple dies can be stacked on top of one another following the processes of blocks 601 and 602. In some embodiments, the dies can have active side facing away from substrate 101 while some dies may have their active sides facing towards substrate 101. The arrow routing from block 602 to block 601 represents stacking of multiple dies on top of one another and coupling their respective bonding pads to ACF layers. In cases where the first die 102 (e.g., the die closest to substrate 101) has its active side facing towards substrate 101, ACF layer 105 is provided which is sandwiched between the composite layer attached to die bonding pad 108 and substrate 101. At block 603, thermo-compression bonding is applied to the composite layers (e.g., pair of ACF and conducting layers) to make electrical connection with bonding pad(s) 115/116.

Figure 7:
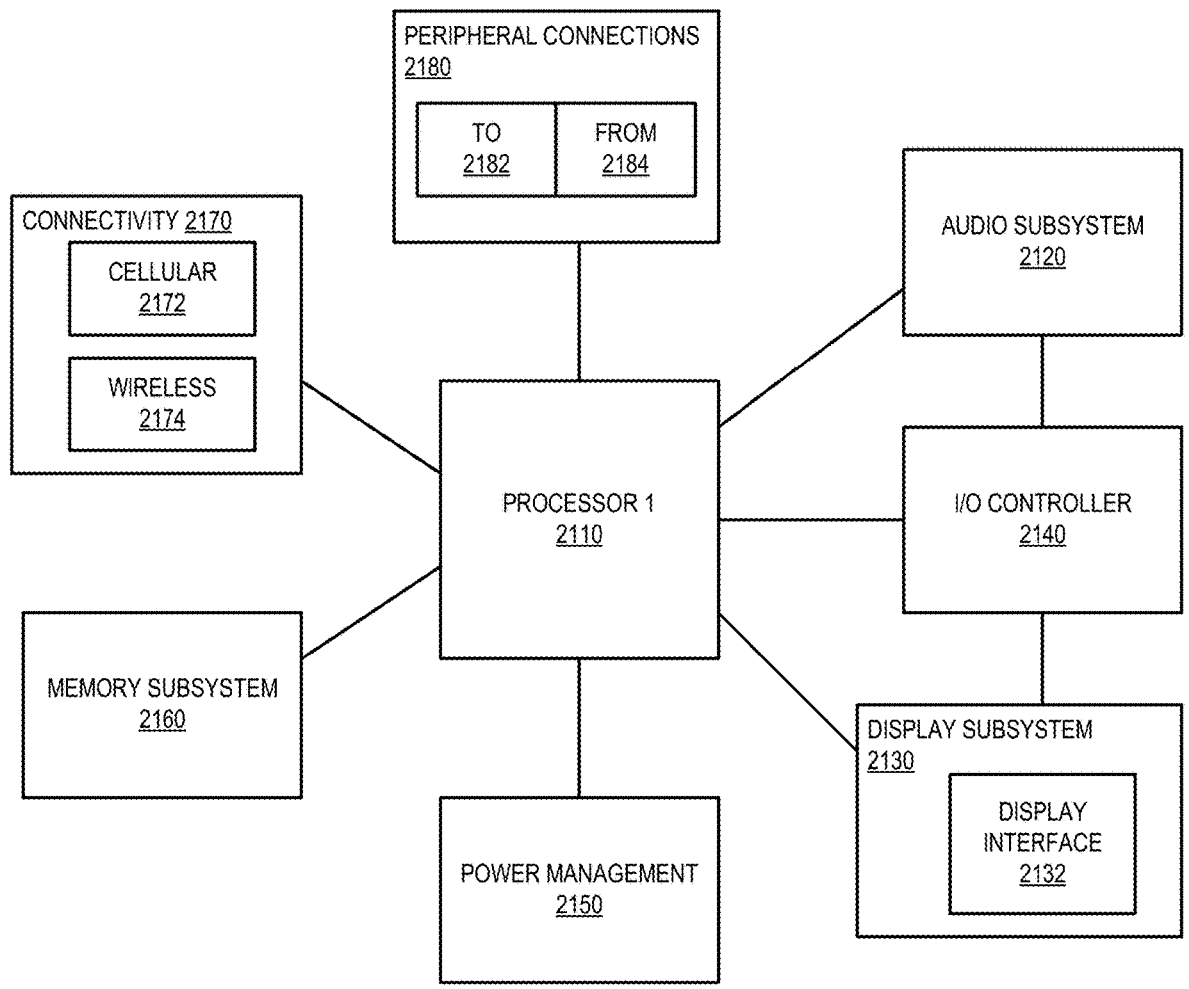
FIG. 7 illustrates a smart device or a computer system or a SoC (System-on-Chip) which is packaged using the composite layer, according to some embodiments.

FIG. 7 illustrates a smart device or a computer system or a SoC (System-on-Chip) which is packaged using the composite layer, according to some embodiments. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 2100 includes a first processor 2110 (e.g., First die 601). The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions. The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus which comprises: a first die having at least one bond pad; a first flexible layer comprising an anisotropic conductive material, wherein the first flexible layer is adjacent to the at least one bond pad such that it makes an electrical contact with the at least one bond pad; and a second flexible layer comprising a conductive metal, wherein the second layer is adjacent to the first flexible layer.

Example 2 includes features of example 1 and comprises a third flexible layer comprising an anisotropic conductive material, wherein the third flexible layer is adjacent to the second flexible layer such that the second flexible layer is sandwiched between the first and third flexible layers.

Example 3 includes features of example 2 wherein the third flexible layer is to electrically contact with at least one bond pad of a substrate.

Example 4 includes features of example 3 wherein the substrate is a package substrate or a printed circuit board.

Example 5 includes features of example 4 and comprises: a second die having at least one bond pad; a fourth flexible layer comprising an anisotropic conductive material, wherein the fourth flexible layer is adjacent to the at least one bond pad of the second die such that it makes an electrical contact with the at least one bond pad of the second die; and a fifth flexible layer comprising a conductive metal, wherein the fifth flexible layer is adjacent to the fourth layer.

Example 6 includes features of example 5 wherein the first and second flexible layers, and the fourth and fifth flexible layers are grouped together away from the first and second dies such that the fourth flexible layer is adjacent to the first flexible layer.

Example 7 includes features of any one of examples 1 to 6 wherein the conductive material comprises a material comprising one of: Cu, Al, or Au.

Example 8 includes features of any one of examples 1 to 6 wherein the anisotropic conductive material comprises metal particles embedded within an adhesive material.

Example 9 includes features of example 8 wherein the adhesive material comprises one of: epoxy, acryl, or resin.

Example 10 is a method which comprises: mounting a first die to a first flexible layer, wherein the first die includes at least one bond pad, wherein the first flexible layer comprises an anisotropic conductive material, wherein the first flexible layer is adjacent to the at least one bond pad such that it makes an electrical contact with the at least one bond pad; and attaching a second flexible layer, comprising a conductive metal, to the first layer.

Example 11 includes features of example 10 which comprises: attaching a third flexible layer to the second flexible layer such that the second flexible layer is sandwiched between the first and third flexible layers, wherein the which third flexible layer comprises an anisotropic conductive material.

Example 12 includes features of any one examples 10 to 11 and comprises: mounting a second die to a fourth flexible layer comprising an anisotropic conductive material, wherein the fourth flexible layer is adjacent to a bond pad of the second die such that it makes an electrical contact with the bond pad of the second die; and attaching a fifth flexible layer to the fourth flexible layer, wherein the fifth flexible layer comprises a conductive metal.

Example 13 includes features of example 12 and comprises: applying thermal compression near an end of the first, second, third and fourth flexible layers such that the first and second flexible layers, and the fourth and fifth flexible layers are grouped together away from the first and second dies, and such that the fourth flexible layer is adjacent to the first flexible layer; and connecting the an end of the third flexible layer to at least one bond pad of a substrate.

Example 14 includes features of example 13 and comprises applying a mold compound that couples to the first and second dies, and to first, second, third, fourth, and fifth flexible layers.

Example 15 includes features of example 10 wherein: the conductive material comprises a material which comprises one of: Cu, Al, or Au; the anisotropic conductive material comprises metal particles embedded within an adhesive material, and the adhesive material comprises one of: epoxy, acryl, or resin.

Example 16 is an apparatus which comprises means for performing a method according to any one of examples 10 to 14.

Example 17 is a system which comprises: a first die comprising a processor which includes at least one bond pad; a second die comprising a memory which includes at least one bond pad, wherein the second die is stacked on top of the first die; a first flexible layer comprising an anisotropic conductive material, wherein the first flexible layer is coupled to the bond pad such that it makes an electrical contact with the bond pad; a second flexible layer comprising a conductive metal, wherein the second flexible layer is coupled to the first flexible layer; a third flexible layer comprising an anisotropic conductive material, wherein the third flexible layer is coupled to the second flexible layer such that the second flexible layer is sandwiched between the first and third flexible layers; a fourth flexible layer comprising an anisotropic conductive material, wherein the fourth flexible layer is coupled to the bond pad of the second die such that it makes an electrical contact with the bond pad of the second die; and a fifth flexible layer comprising a conductive metal, wherein the fifth flexible layer is coupled to the fourth flexible layer; a package encasing the first and second dies, and the first, second, third, fourth, and fifth flexible layers; a motherboard coupled to the third flexible layer; and a wireless interface coupled to the motherboard for allowing the processor of the first die to communicate with another device.

Example 18 includes features of example 17 wherein the anisotropic conductive material comprises metal particles embedded within an adhesive material.

Example 19 includes features of example 17 wherein the motherboard includes at least one bond pad, and wherein the first, second, fourth, and fifth flexible layers are grouped together away from the first and second dies such that the fourth flexible layer is adjacent to the first flexible layer, and such that a portion of the first flexible layer is in electrical contact with the at least one bond pad of the motherboard.

Example 20 includes features of any one of examples 17 to 19 wherein the conductive material comprises a material which includes one of: Cu, Al, or Au.

Example 21 includes features of any one of examples 17 to 19 wherein the adhesive material comprises one of: epoxy, acryl, or resin.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a first die having at least one bond pad;
   a first flexible layer comprising an anisotropic conductive material, wherein the first flexible layer is adjacent to the at least one bond pad such that it makes an electrical contact with the at least one bond pad;
   a second flexible layer comprising a conductive metal, wherein the second layer is adjacent to the first flexible layer;
   a second die having at least one bond pad;
   a fourth flexible layer comprising an anisotropic conductive material, wherein the fourth flexible layer is adjacent to the at least one bond pad of the second die such that it makes an electrical contact with the at least one bond pad of the second die; and
   a fifth flexible layer comprising a conductive metal, wherein the fifth flexible layer is adjacent to the fourth layer.

2. The apparatus of claim 1 comprises a third flexible layer comprising an anisotropic conductive material, wherein the third flexible layer is adjacent to the second flexible layer such that the second flexible layer is between the first and third flexible layers.

3. The apparatus of claim 2, wherein the third flexible layer is to electrically contact with at least one bond pad of a substrate.

4. The apparatus of claim 3, wherein the substrate is a package substrate or a printed circuit board.

5. The apparatus of claim 1, wherein the first and second flexible layers, and the fourth and fifth flexible layers are grouped together away from the first and second dies such that the fourth flexible layer is adjacent to the first flexible layer.

6. The apparatus of claim 1, wherein the conductive material comprises a material comprising one or more of: Cu, Al, or Au.

7. The apparatus of claim 1, wherein the anisotropic conductive material comprises metal particles embedded within an adhesive material.

8. The apparatus of claim 7, wherein the adhesive material comprises one of: epoxy, acryl, or resin.

9. A method comprising:
   mounting a first die to a first flexible layer, wherein the first die includes at least one bond pad, wherein the first flexible layer comprises an anisotropic conductive material, wherein the first flexible layer is adjacent to the at least one bond pad such that it makes an electrical contact with the at least one bond pad;
   attaching a second flexible layer to the first layer, wherein the second flexible layer comprises a conductive metal;
   attaching a third flexible layer to the second flexible layer such that the second flexible layer is between the first and third flexible layers, wherein which the third flexible layer comprises an anisotropic conductive material;

mounting a second die to a fourth flexible layer comprising an anisotropic conductive material, wherein the fourth flexible layer is adjacent to a bond pad of the second die such that it makes an electrical contact with the bond pad of the second die; and attaching a fifth flexible layer to the fourth flexible layer, wherein the fifth flexible layer comprises a conductive metal.

10. The method of claim 9 comprises:

applying thermal compression near an end of the first, second, third and fourth flexible layers such that the first and second flexible layers, and the fourth and fifth flexible layers are grouped together away from the first and second dies, and such that the fourth flexible layer is adjacent to the first flexible layer; and connecting an end of the third flexible layer to at least one bond pad of a substrate.

11. The method of claim 10 comprising: applying a mold compound that couples to the first and second dies, and to first, second, third, fourth, and fifth flexible layers.

12. The method of claim 9, wherein:

the conductive material comprises a material which comprises one of: Cu, Al, or Au;

the anisotropic conductive material comprises metal particles embedded within an adhesive material; and the adhesive material comprises one of: epoxy, acryl, or resin.

13. A system comprising:

a first die comprising a processor which includes at least one bond pad;

a second die comprising a memory which includes at least one bond pad, wherein the second die is stacked on top of the first die;

a first flexible layer comprising an anisotropic conductive material, wherein the first flexible layer is coupled to the bond pad such that it makes an electrical contact with the bond pad;

a second flexible layer comprising a conductive metal, wherein the second flexible layer is coupled to the first flexible layer;

a third flexible layer comprising an anisotropic conductive material, wherein the third flexible layer is coupled to the second flexible layer such that the second flexible layer is between the first and third flexible layers;

a fourth flexible layer comprising an anisotropic conductive material, wherein the fourth flexible layer is coupled to the bond pad of the second die such that it makes an electrical contact with the bond pad of the second die;

a fifth flexible layer comprising a conductive metal, wherein the fifth flexible layer is coupled to the fourth flexible layer;

a package encasing the first and second dies, and the first, second, third, fourth, and fifth flexible layers;

a motherboard coupled to the third flexible layer; and a wireless interface coupled to the motherboard for allowing the processor of the first die to communicate with another device.

14. The system of claim 13, wherein the anisotropic conductive material comprises metal particles embedded within an adhesive material.

15. The system of claim 14, wherein the conductive material comprises a material which includes one or more of: Cu, Al, or Au.

16. The system of claim 14, wherein the adhesive material comprises one of: epoxy, acryl, or resin.

17. The system of claim 13, wherein the motherboard includes at least one bond pad, and wherein the first, second, fourth, and fifth flexible layers are grouped together away from the first and second dies such that the fourth flexible layer is adjacent to the first flexible layer, and such that a portion of the first flexible layer is in electrical contact with the at least one bond pad of the motherboard.

\* \* \* \* \*